US011362668B1

(12) United States Patent
Brugger et al.

(10) Patent No.: US 11,362,668 B1
(45) Date of Patent: Jun. 14, 2022

(54) LEAKAGE COMPENSATION FOR ANALOG DECODED THERMOMETRIC DIGITAL-TO-ANALOG CONVERTER (DAC)

(71) Applicant: Infineon Technologies AG, Neubiberg (DE)

(72) Inventors: Florian Brugger, Villach (AT); Wolfgang Milachowski, Spittal (AT); Christoph Schroers, Villach (AT)

(73) Assignee: Infineon Technologies AG

( * ) Notice: Subject to any disclaimer, the term of this patent is extended or adjusted under 35 U.S.C. 154(b) by 0 days.

(21) Appl. No.: 17/224,425

(22) Filed: Apr. 7, 2021

(51) Int. Cl.
*H03M 1/06* (2006.01)
*H03M 1/74* (2006.01)

(52) U.S. Cl.
CPC ......... *H03M 1/0604* (2013.01); *H03M 1/747* (2013.01); *H03M 1/0678* (2013.01); *H03M 1/742* (2013.01)

(58) Field of Classification Search
CPC .. H03M 1/0604; H03M 1/0678; H03M 1/742; H03M 1/745; H03M 1/747
USPC ......................................... 341/135-136, 144
See application file for complete search history.

(56) References Cited

U.S. PATENT DOCUMENTS

| | | | |
|---|---|---|---|
| 6,226,322 B1 | 5/2001 | Mukherjee | |
| 6,664,909 B1 | 12/2003 | Hyde et al. | |
| 6,995,612 B1 | 2/2006 | Chen | |
| 7,868,808 B2 * | 1/2011 | Caplan | H03L 7/0898 327/147 |
| 9,621,181 B2 * | 4/2017 | Kuo | H03M 1/664 |
| 9,866,234 B1 | 1/2018 | Tseng | |
| 2010/0141491 A1 | 6/2010 | Caplan et al. | |
| 2010/0259429 A1 | 10/2010 | Haroun et al. | |
| 2013/0076549 A1 | 3/2013 | Bajdechi et al. | |
| 2018/0217624 A1 | 8/2018 | Shiine et al. | |

FOREIGN PATENT DOCUMENTS

WO 2004013970 A1 2/2004

* cited by examiner

*Primary Examiner* — Khai M Nguyen
(74) *Attorney, Agent, or Firm* — Design IP

(57) ABSTRACT

A method of converting an N-bit digital code into analog output currents includes switchably connecting a first number of PN junctions to a positive output terminal and a second number of PN junctions to a negative output terminal based on the N-bit digital code; and switchably connecting a plurality of additional PN junctions to the positive output terminal and the negative output terminal based on the N-bit digital code, including connecting a first number of additional PN junctions to the positive output terminal based on the N-bit digital code and connecting a second number of additional PN junctions to the negative output terminal based on the N-bit digital code such that a first sum of the first number of PN junctions and the first number of additional PN junctions is equal to a second sum of the second number of PN junctions and the second number of additional PN junctions.

22 Claims, 14 Drawing Sheets

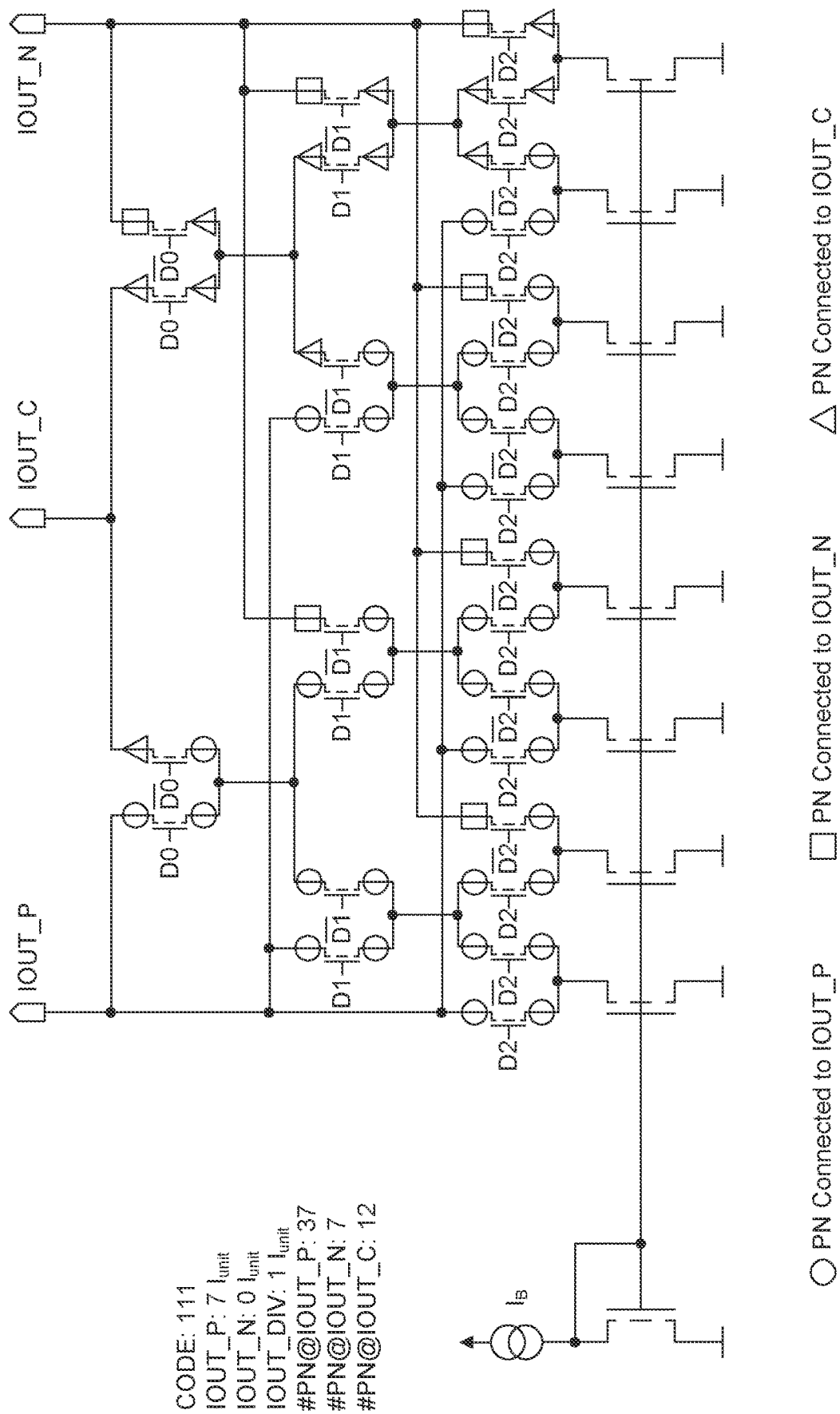

| 3-bit DAC Code | | | Decimal Value | Output Currents | | | #PN@IOUT_P | | #PN@IOUT_C | #PN@IOUT_N | | #PN Total | |
|---|---|---|---|---|---|---|---|---|---|---|---|---|---|
| D2 | D1 | D0 | | IOUT_P | IOUT_C | IOUT_N | Uncompensated | Compensated | | Uncompensated | Compensated | Uncompensated | Compensated |
| 0 | 0 | 0 | 0 | 0 | 1 | 7 | 7 | 40 | 12 | 37 | 40 | 56 | 92 |
| 0 | 0 | 1 | 1 | 1 | 1 | 6 | 17 | 40 | 12 | 27 | 40 | 56 | 92 |
| 0 | 1 | 0 | 2 | 2 | 1 | 5 | 19 | 40 | 12 | 25 | 40 | 56 | 92 |
| 0 | 1 | 1 | 3 | 3 | 1 | 4 | 29 | 40 | 12 | 15 | 40 | 56 | 92 |
| 1 | 0 | 0 | 4 | 4 | 1 | 3 | 15 | 40 | 12 | 29 | 40 | 56 | 92 |
| 1 | 0 | 1 | 5 | 5 | 1 | 2 | 25 | 40 | 12 | 19 | 40 | 56 | 92 |
| 1 | 1 | 0 | 6 | 6 | 1 | 1 | 27 | 40 | 12 | 17 | 40 | 56 | 92 |
| 1 | 1 | 1 | 7 | 7 | 1 | 0 | 37 | 40 | 12 | 7 | 40 | 56 | 92 |

FIG. 3C

| 4-bit DAC Code | | | | Decimal Value | Output Currents | | | #PN@IOUT_P | | #PN@IOUT_C | #PN@IOUT_N | | #PN Total | |
|---|---|---|---|---|---|---|---|---|---|---|---|---|---|---|
| D3 | D2 | D1 | D0 | | IOUT_P | IOUT_C | IOUT_N | Uncompen-sated | Compen-sated | | Uncompen-sated | Compen-sated | Uncompen-sated | Compen-sated |
| 0 | 0 | 0 | 0 | 0 | 0 | 1 | 15 | 15 | 93 | 16 | 89 | 93 | 120 | 202 |
| 0 | 0 | 0 | 1 | 1 | 1 | 1 | 14 | 29 | 93 | 16 | 75 | 93 | 120 | 202 |
| 0 | 0 | 1 | 0 | 2 | 2 | 1 | 13 | 35 | 93 | 16 | 69 | 93 | 120 | 202 |
| 0 | 0 | 1 | 1 | 3 | 3 | 1 | 12 | 49 | 93 | 16 | 55 | 93 | 120 | 202 |
| 0 | 1 | 0 | 0 | 4 | 4 | 1 | 11 | 39 | 93 | 16 | 65 | 93 | 120 | 202 |
| 0 | 1 | 0 | 1 | 5 | 5 | 1 | 10 | 53 | 93 | 16 | 51 | 93 | 120 | 202 |
| 0 | 1 | 1 | 0 | 6 | 6 | 1 | 9 | 59 | 93 | 16 | 45 | 93 | 120 | 202 |
| 0 | 1 | 1 | 1 | 7 | 7 | 1 | 8 | 73 | 93 | 16 | 31 | 93 | 120 | 202 |
| 1 | 0 | 0 | 0 | 8 | 8 | 1 | 7 | 31 | 93 | 16 | 73 | 93 | 120 | 202 |
| 1 | 0 | 0 | 1 | 9 | 9 | 1 | 6 | 45 | 93 | 16 | 59 | 93 | 120 | 202 |
| 1 | 0 | 1 | 0 | 10 | 10 | 1 | 5 | 51 | 93 | 16 | 53 | 93 | 120 | 202 |
| 1 | 0 | 1 | 1 | 11 | 11 | 1 | 4 | 65 | 93 | 16 | 39 | 93 | 120 | 202 |
| 1 | 1 | 0 | 0 | 12 | 12 | 1 | 3 | 55 | 93 | 16 | 49 | 93 | 120 | 202 |
| 1 | 1 | 0 | 1 | 13 | 13 | 1 | 2 | 69 | 93 | 16 | 35 | 93 | 120 | 202 |
| 1 | 1 | 1 | 0 | 14 | 14 | 1 | 1 | 75 | 93 | 16 | 29 | 93 | 120 | 202 |
| 1 | 1 | 1 | 1 | 15 | 15 | 1 | 0 | 89 | 93 | 16 | 15 | 93 | 120 | 202 |

FIG. 5

LEAKAGE COMPENSATION FOR ANALOG DECODED THERMOMETRIC DIGITAL-TO-ANALOG CONVERTER (DAC)

BACKGROUND

A digital-to-analog converter (DAC) is used to bridge the digital domain and the analog domain in many applications that require high speed, low cost, and high resolution data. There is often a trade-off between precision and cost or die area. A thermometric (i.e., thermometer-coded) DAC provides a fast and high precision DAC architecture but at the expense of requiring many components and wire segments. A thermometric DAC contains an equal resistor or current source segment for each possible value of DAC output.

If a thermometric DAC is required (e.g., for monotonicity) and is to be controlled by a binary input code, binary-to-thermometer decoding is required to control each current source. This function can be implemented in two ways. First, a digital decoder can be connected that converts the N input bits to $2^N$ output signals to switches the current sources. This will give best analog performance in terms of speed but at the cost of area. Second, an analog switch matrix connected in series to the current sources may be used to provide the binary-to-thermometer decoding. The second method provides a more economical solution in terms of area. On top of this, high resolution DACs can be comprised of two or more cascaded DACs.

One disadvantage of using an analog switch matrix to provide the binary-to-thermometer decoding is the large number of switches (e.g., transistors) in the analog circuitry the current has to flow through. The switches have non-idealities such as parasitic capacitances and leakage current. While the parasitic capacitance of the switches slows down the DAC, the linearity of the DAC is limited by the leakage of the switches. More particular, a thermometric DAC is known to be monotonous by design. The only limitation on this is the leakage of the switches in the analog switch matrix. Simulations show that it is not the channel leakage (which can be reduced by special implants, high voltage threshold (VT) devices, negative gate-source voltage VGS when off, etc.), but the leakage between diffusions of drain and source and the bulk node. In other words, the leakage occurs at the p-n (PN) junctions of the switches. This means that every switch sinks some current from its drain as well as its source to ground. Unfortunately, the amount of PN junctions connected to a negative and a positive output terminal of the DAC vary with the chosen DAC input code, thus linearity and monotonicity errors can occur.

Therefore, an improved device capable of dynamically compensating for leakage current in an analog decoded thermometric DAC as the DAC input code varies may be desirable.

SUMMARY

One or more embodiments provide a thermometric digital-to-analog converter (DAC) configured to convert an N-bit digital code into analog output currents, wherein N is an integer greater than one, the thermometric DAC including: $2^N$ current sources configured to generate $2^N$ currents; a positive output terminal configured to receive a first portion of the $2^N$ currents as a first output current based on the N-bit digital code; a negative output terminal configured to receive a second portion of the $2^N$ currents as a second output current based on the N-bit digital code, wherein the second portion is inversely proportional to the first portion; an analog transistor matrix coupled between the $2^N$ current sources and the positive and negative output terminals, wherein the analog transistor matrix includes a plurality of PN junctions that are switchably connected to the positive output terminal and the negative output terminal based on the N-bit digital code, including a first number of PN junctions connected to the positive output terminal that varies based on the N-bit digital code and a second number of PN junctions connected to the negative output terminal that varies based on N-bit digital code; and a compensation circuit including a plurality of additional PN junctions that are switchably connected to the positive output terminal and the negative output terminal based on the N-bit digital code, wherein the compensation circuit is configured to connect a first number of additional PN junctions to the positive output terminal based on the N-bit digital code and connect a second number of additional PN junctions to the negative output terminal based on the N-bit digital code such that a first sum of the first number of PN junctions and the first number of additional PN junctions is equal to a second sum of the second number of PN junctions and the second number of additional PN junctions.

One or more embodiments provide a method of converting an N-bit digital code into analog output currents, wherein N is an integer greater than one, the method including: generating $2^N$ currents; receiving, by a positive output terminal, a first portion of the $2^N$ currents as a first output current based on the N-bit digital code; receiving, by a negative output terminal, a second portion of the $2^N$ currents as a second output current based on the N-bit digital code, wherein the second portion is inversely proportional to the first portion; switchably connecting a plurality of PN junctions to the positive output terminal and the negative output terminal based on the N-bit digital code, including a first number of PN junctions connected to the positive output terminal that varies based on the N-bit digital code and a second number of PN junctions connected to the negative output terminal that varies based on N-bit digital code; and switchably connecting a plurality of additional PN junctions to the positive output terminal and the negative output terminal based on the N-bit digital code, including connecting a first number of additional PN junctions to the positive output terminal based on the N-bit digital code and connecting a second number of additional PN junctions to the negative output terminal based on the N-bit digital code such that a first sum of the first number of PN junctions and the first number of additional PN junctions is equal to a second sum of the second number of PN junctions and the second number of additional PN junctions.

BRIEF DESCRIPTION OF THE DRAWINGS

Embodiments are described herein making reference to the appended drawings.

FIGS. 2A-2H are schematic diagrams of the 3-bit thermometric DAC shown in FIG. 1, along with respective current paths and PN junctions connected to each output terminal according to one or more embodiments;

FIG. 3C shows a table for a 3-bit DAC that summarizes the output currents at each output terminal originating from a current source stage, a number of PN junctions connected to each output terminal based on the input DAC code, and a number of additional PN junctions connected to each output terminal based on the input DAC code;

FIG. 5 shows a table for a 4-bit DAC that summarizes the output currents at each output terminal originating from a current source stage, a number of PN junctions connected to each output terminal based on the input DAC code, and a number of additional PN junctions connected to each output terminal based on the input DAC code.

DETAILED DESCRIPTION

Figure 1:
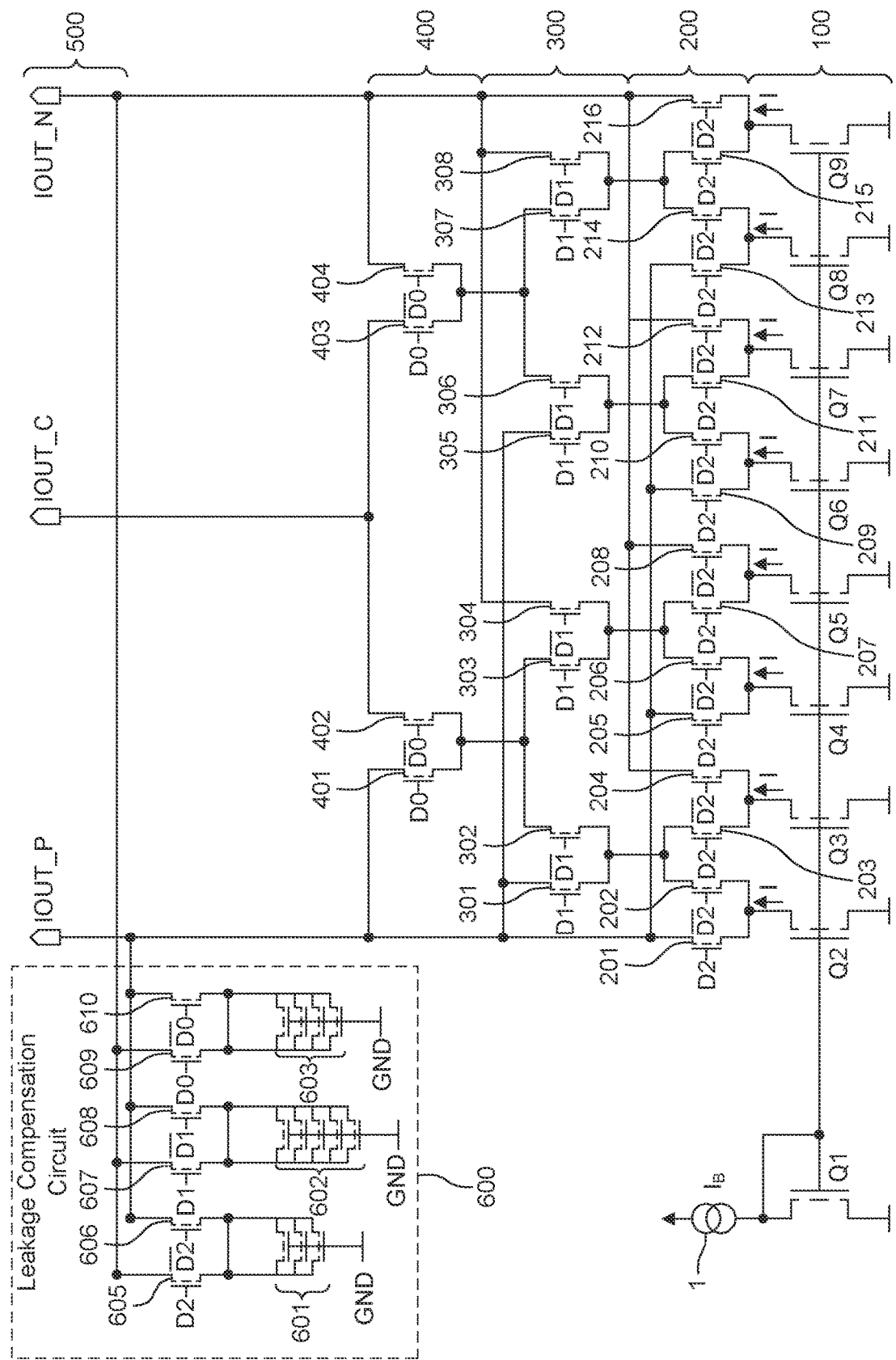
FIG. 1 is a schematic diagram of a 3-bit thermometric DAC with a leakage current compensation circuit according to one or more embodiments.
Figure 2A:
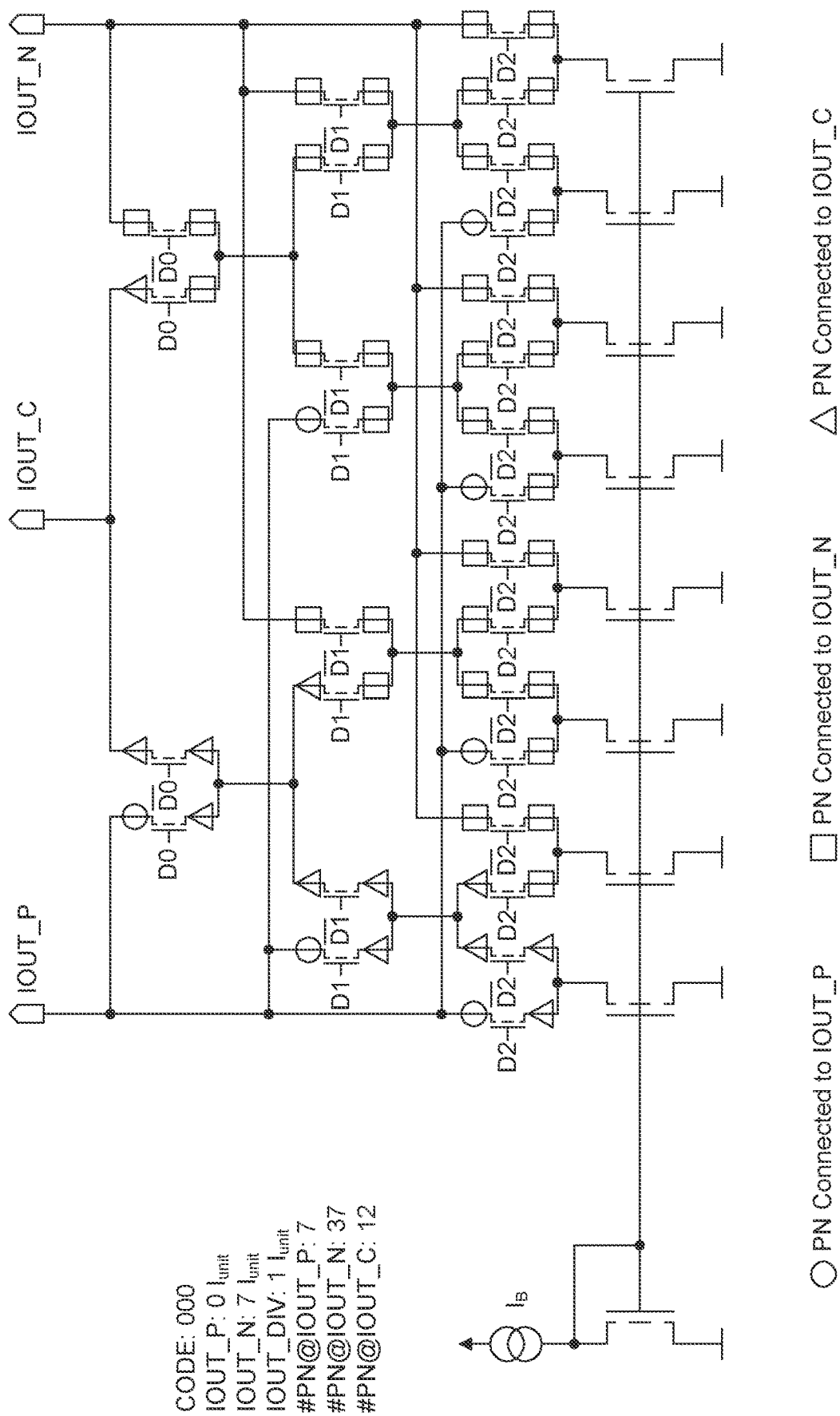
Figure 2B:
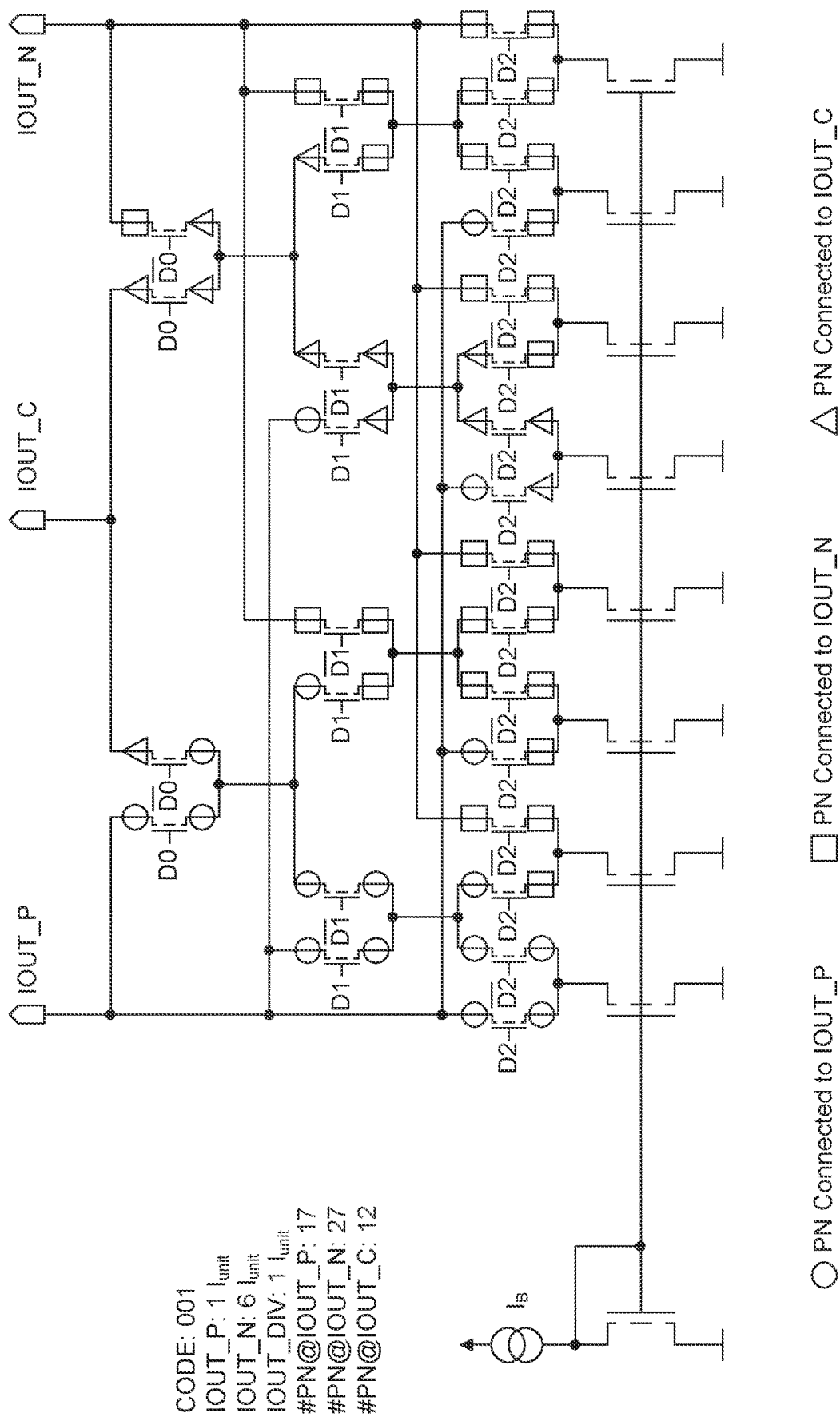
Figure 2C:
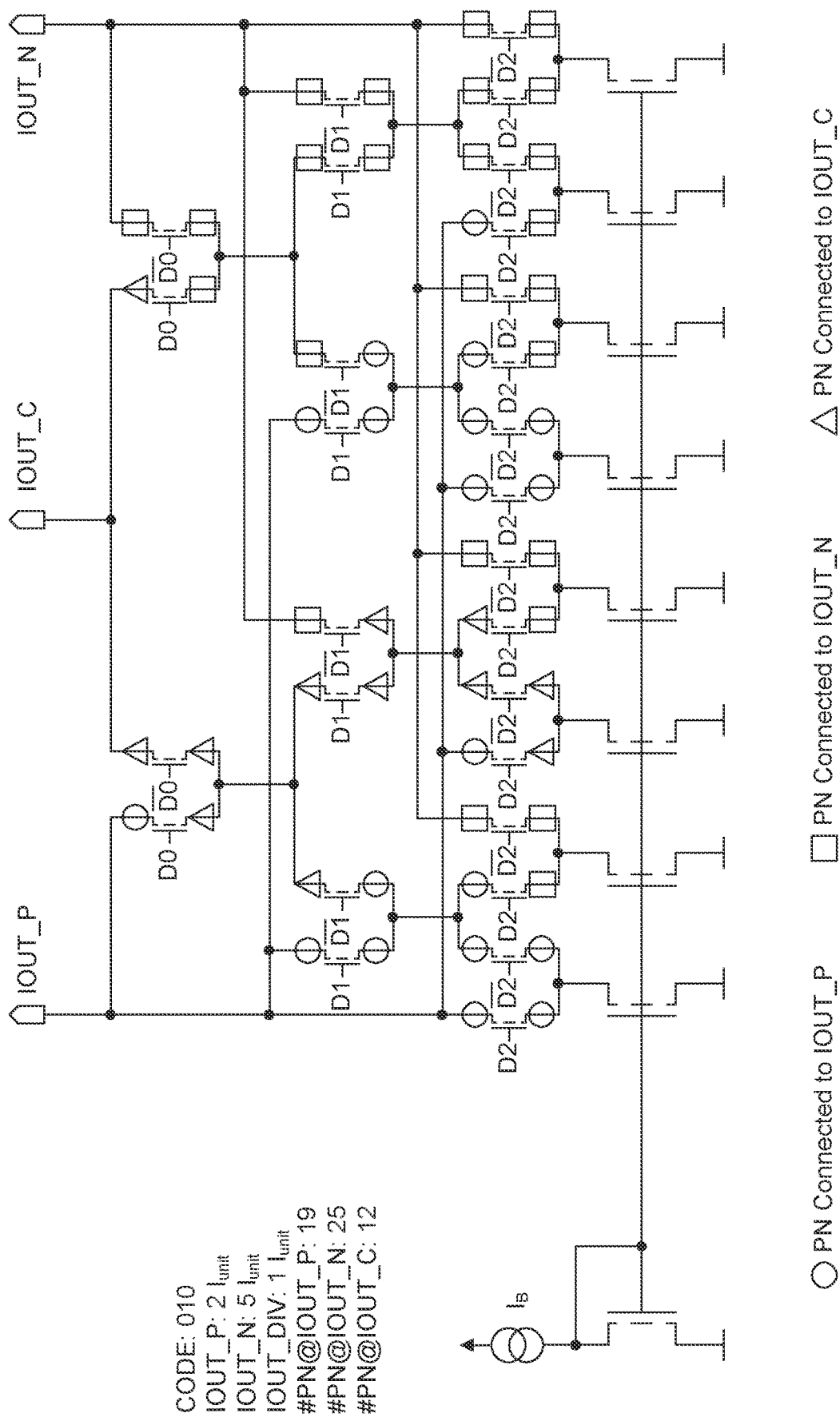
Figure 2D:
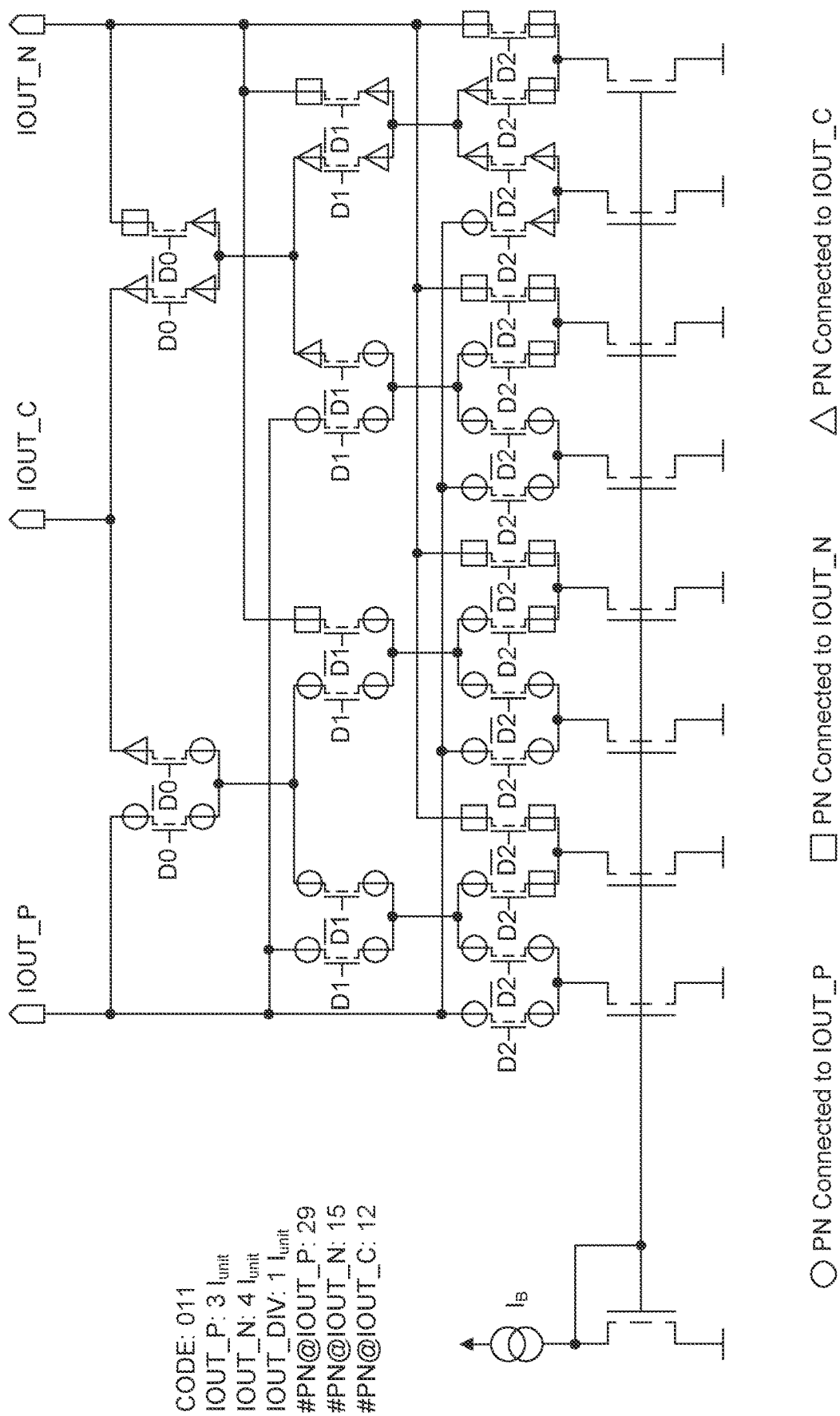
Figure 2E:
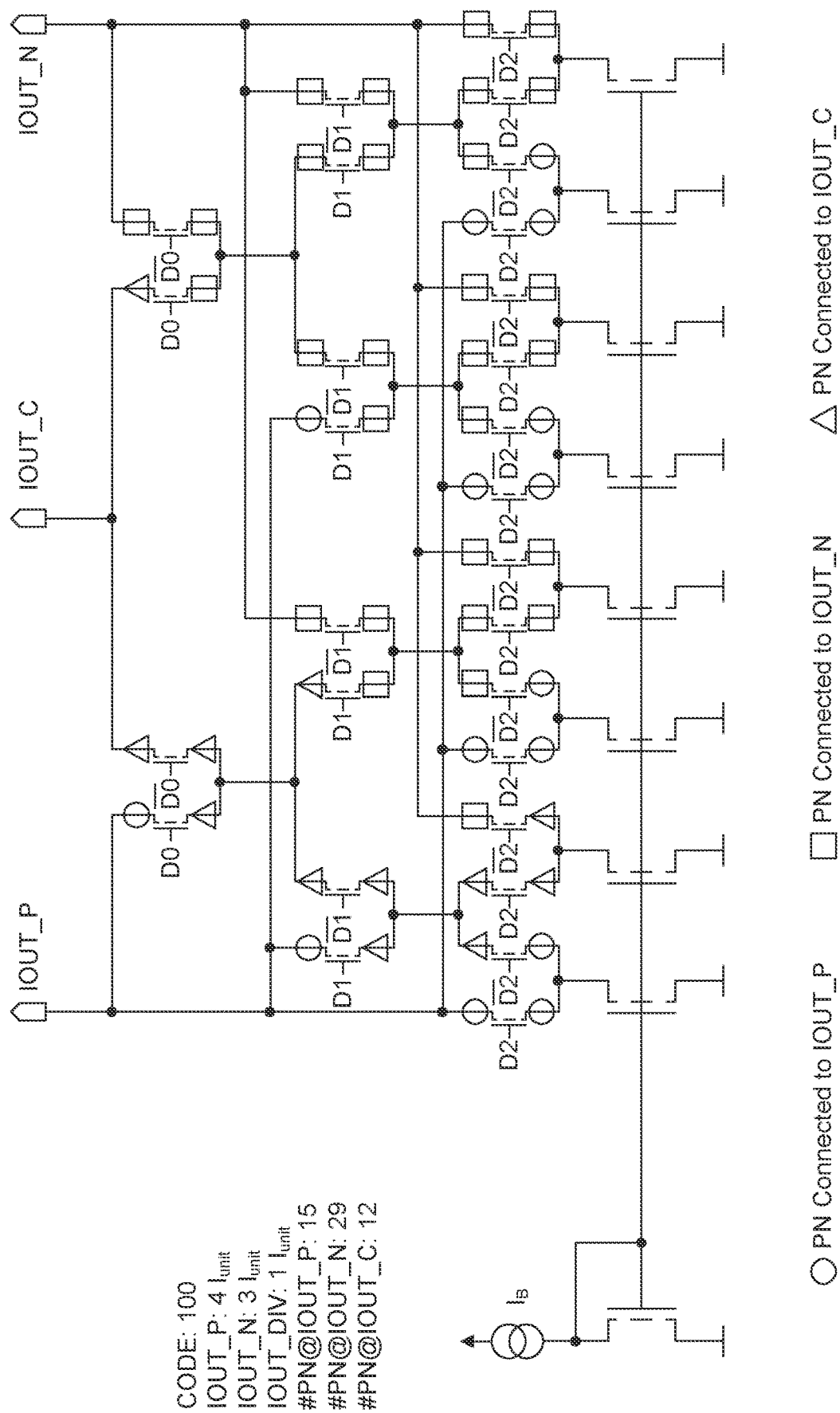
Figure 2F:
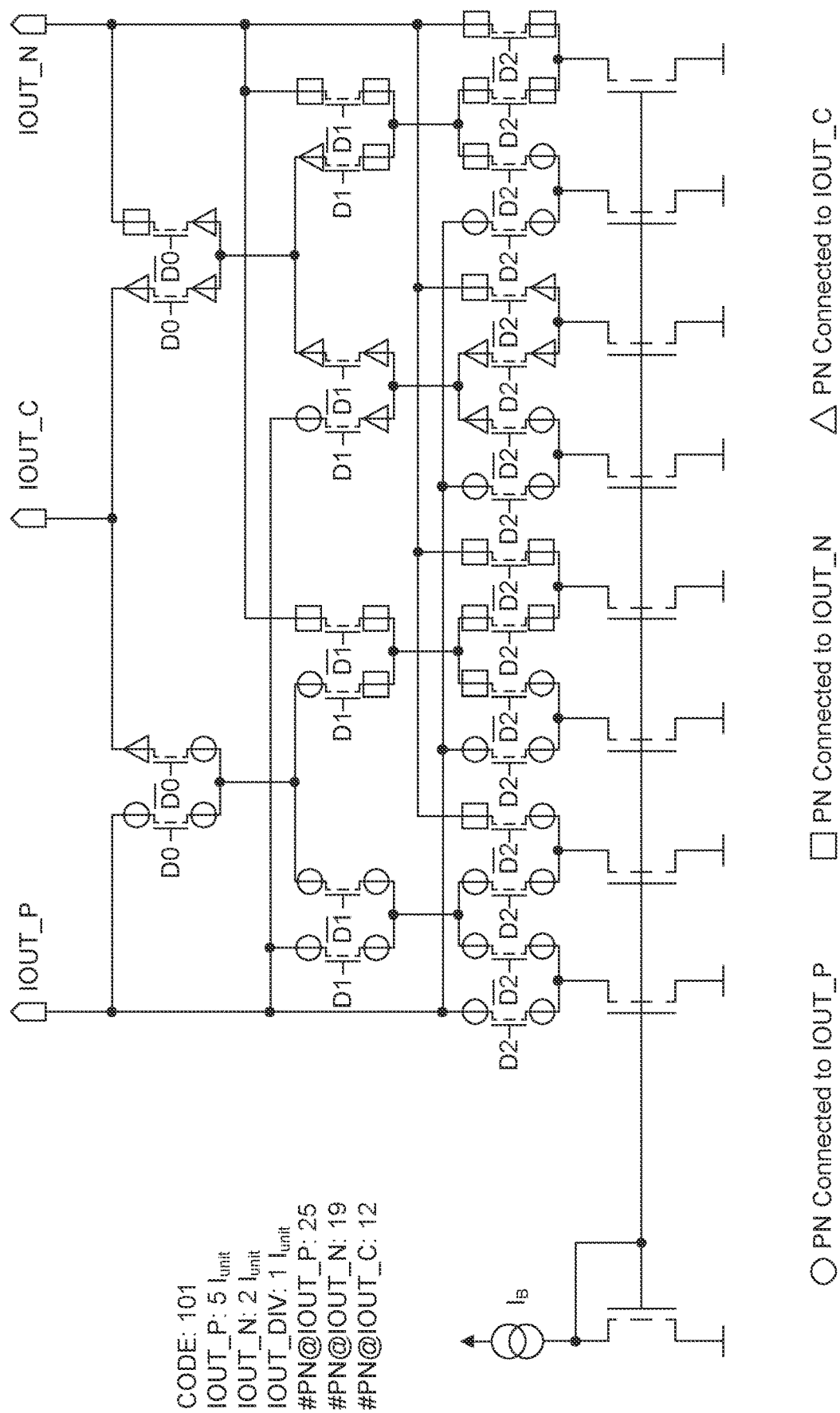
Figure 2G:
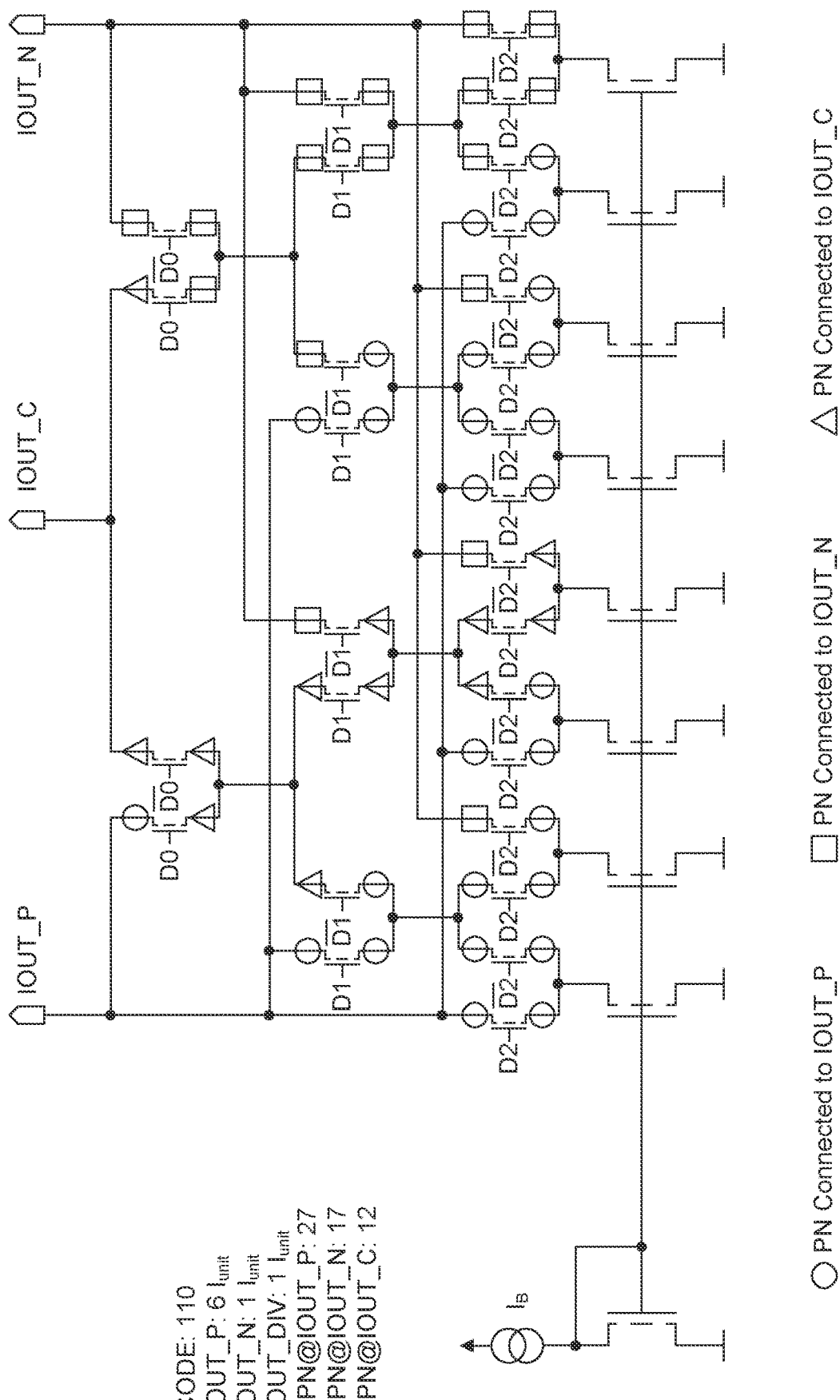

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Embodiments are directed to compensating for leakage currents in a thermometric digital-to-analog converter (DAC) that uses an analog switch matrix architecture. The analog switch matrix architecture is a cascaded current steering architecture that provides an area-efficient means of converting a binary DAC input code to an analog thermometer quantity, such as analog output currents.

FIG. 1 is a schematic diagram of a 3-bit thermometric DAC with a leakage current compensation circuit according to one or more embodiments. It will be appreciated that while a 3-bit DAC is used as an example, the concepts described herein can be applied to any multi-bit DAC. The thermometric DAC includes an analog switch matrix comprising a cascaded architecture of metal-oxide-semiconductor field-effect transistors (MOSFETs) as switches. In the following example, the 3-bit input code is represented by bits D2, D1, and D0, where D2 is the most-significant bit (MSB) and D0 is the least significant bit (LSB).

The thermometric DAC includes a current source stage 100 (i.e., an input current stage) that includes a reference current source 1 that generates an input bias current IB, a reference transistor Q1 that drives multiple slave transistors Q2-Q9 as current sources, and the transistors Q2-Q9 that inject equal currents I into the analog switch matrix. In other words, the transistors Q1-Q9 are matched. The thermometric DAC contains a current source for each possible value of DAC output. For a 3-bit thermometer DAC, there are eight possible decimal values (0-7), meaning that in this example there are eight current-sources Q2-Q9 that each inject current I into the analog switch matrix. In other words, the thermometric DAC converts an N-bit digital code and includes $2^N$ current sources configured to generate $2^N$ currents, where N is an integer greater than one.

The analog switch matrix is coupled between the current source stage 100 (i.e., an input current stage) and an output current stage 500. The output current stage 500 includes three output terminals that output current received from the analog switch matrix. The three output terminals include a positive output terminal IOUT_P, a negative output terminal IOUT_N, and a center output terminal IOUT_C that is arranged and coupled between the other two output terminals.

The analog switch matrix includes N number of cascaded stages of switches (e.g., MOSFETs), where N is equal to the number of bits of the DAC (i.e., the binary bus width of the DAC). In this example, N=3 for a 3-bit DAC. Specifically, the analog switch matrix includes a first stage 200 comprising switches 201-216 that are controlled by the MSB (i.e., bit N or D2) of an input code, a second stage 300 comprising switches 301-308 that are controlled by the next MSB (i.e., bit N-1 or D1) of the input code, and a third stage 400 comprising switches 401-404 that are controlled by the next MSB (i.e., bit N-2 or D0) of the input code. The last stage that is directly coupled to the output stage is also the LSB stage of the analog switch matrix. The bit values D2, D1, and D0 or inverted bit values thereof are provided to the gate terminals of their respective switches to control an on/off state thereof.

The switches are arranged in pairs, with each pair having a load terminal (e.g., a drain terminal) directly coupled together and receiving a current portion from the previous stage. The switches of a pair are complementary to each other, meaning when one switch of the pair is on and the other switch of the pair is off. For example, one switch may receive an inverted bit value at its gate to place the switch's on/off state in the opposite state of its paired counterpart. For example, transistors 201 and 202 form a transistor pair with transistor 201 receiving D2 at its gate and with transistor 202 receiving inverted D2 (i.e., NOT D2) at its gate. Transistors 203 and 204 form another pair, transistors 205 and 206 form another pair, transistors 301 and 302 form another pair, transistors 401 and 402 form another pair, and so on. Thus, stage 200 includes 8 complementary pairs, stage 300 includes 4 complementary pairs, and stage 400 includes 2 complementary pairs.

The switches of the analog switch matrix (i.e., switches 201-216, 301-308, and 401-404) are configured to steer the injected currents I to one of three output terminals based on the digital input code, with the weight of each output current corresponding to the digital input code. A weighed value of an output current shifts based on the current steered thereto, which of course depends on the digital input code. The output current at the center output terminal IOUT_C is always constant at a single unit of current (i.e., I) regardless of the digital input code. Thus, the weighted currents at the positive output terminal IOUT_P and the negative output terminal IOUT_N vary inversely to each other based on the digital input code. In other words, the thermometric DAC converts the N-bit digital code into analog output currents by steering portions of the $2^N$ currents to the output terminals IOUT_P, IOUT_N, and IOUT_C according to the N-bit digital code.

For example, where the sum of the sourced currents is 81: for an input code of 000, IOUT_P=0, IOUT_N=71, and IOUT_C=I; for an input code of 001, IOUT_P=I, IOUT_N=61, and IOUT_C=I; for an input code of 010, IOUT_P=21, IOUT_N=SI, and IOUT_C=I; for an input code of 011, IOUT_P=31, IOUT_N=41, and IOUT_C=I; for an input code of 100, IOUT_P=41, IOUT_N=31, and IOUT_C=I; for an input code of 101, IOUT_P=SI, IOUT_N=21, and IOUT_C=I; for an input code of 110, IOUT_P=61, IOUT_N=I, and IOUT_C=I; and for an input code of 111, IOUT_P=71, IOUT_N=0, and IOUT_C=I.

Assuming positive-only current sources, the positive analog output is always increasing as the digital input increases. Accordingly, the analog current values at the positive output terminal IOUT_P and the negative output terminal IOUT_N are a translation of the digital input code.

A transistor pair steers a current portion received from the previous stage to either a left node or to a right node that is downstream from the transistor pair. For example, transistors 201 and 202 form a transistor pair that receives a current I (i.e., a current unit) from current source Q2 of the current source stage 100 and steers the received current I either left to the positive output terminal IOUT_P when D2=1 (i.e., switch 201 is on and switch 202 is off) or right to the input of transistor pair 301 and 302 when D2=0 (i.e., switch 201 is off and switch 202 is on). As another example, transistors 203 and 204 form a transistor pair that receives a current I from current source Q3 of the current source stage 100 and steers the received current I either left to the input of transistor pair 301 and 302 when D2=1 (i.e., switch 203 is on and switch 204 is off) or right to the negative output terminal IOUT_N when D2=0 (i.e., switch 203 is off and switch 204 is on). Transistor pair 301 and 302 then either steers a received current either left to the positive output terminal IOUT_P when D1=1 (i.e., switch 301 is on and switch 302 is off) or right to the input of transistor pair 401 and 402 when D1=0 (i.e., switch 301 is off and switch 302 is on).

Each switch 201-216, 301-308, and 401-404 comprises two PN junctions (i.e., a source-gate PN junction and a drain-gate PN junction). Accordingly, there are 56 total PN junctions in a 3-bit DAC (i.e., #PNtotal=56), each with some leakage current that is directed to either the positive output terminal IOUT_P or the negative output terminal IOUT_N depending on the input code. Thus, the current output at the positive output terminal IOUT_P and the negative output terminal IOUT_N can deviate from the intended analog values as a result of the leakage currents. Moreover, the number of leakage currents directed to a particular output terminal varies based on the number of PN junctions connected to that output terminal and this number changes based on the input code. In other words, without compensation, the leakage currents can cause an imbalance in currents output at the positive output terminal IOUT_P and the negative output terminal IOUT_N and this imbalance can change depending on the input code.

As a result, a goal of compensating the leakage currents is to ensure that an equal amount of leakage current flows out of both the positive output terminal IOUT_P and the negative output terminal IOUT_N regardless of the input code. In this way the leakage currents present at the positive output terminal IOUT_P and the negative output terminal IOUT_N cancel each other out based on a common mode principle.

Assuming equal leakage current in every device and PN junction, the amount of additional current in the positive and negative output (IOUT_P, IOUT_N) is deterministic.

FIGS. 2A-2H are schematic diagrams of the 3-bit thermometric DAC shown in FIG. 1, along with respective current paths and PN junctions connected to each output terminal IOUT_P, IOUT_N, and I_OUTC. #PN@IOUT_P indicates the number of PN junctions connected to output terminal IOUT_P for a particular input code, #PN@IOUT_N indicates the number of PN junctions connected to output terminal IOUT_N for a particular input code, and #PN@IOUT_C indicates the number of PN junctions connected to output terminal IOUT_C for a particular input code. It is noted that the center output terminal OUT_C is always connected to a same number of PN junctions (i.e., 12 PN junctions for a 3-bit DAC) and receives a single unit of current I from the analog switch matrix regardless of (i.e., independent of) the input code.

Figure 3A:
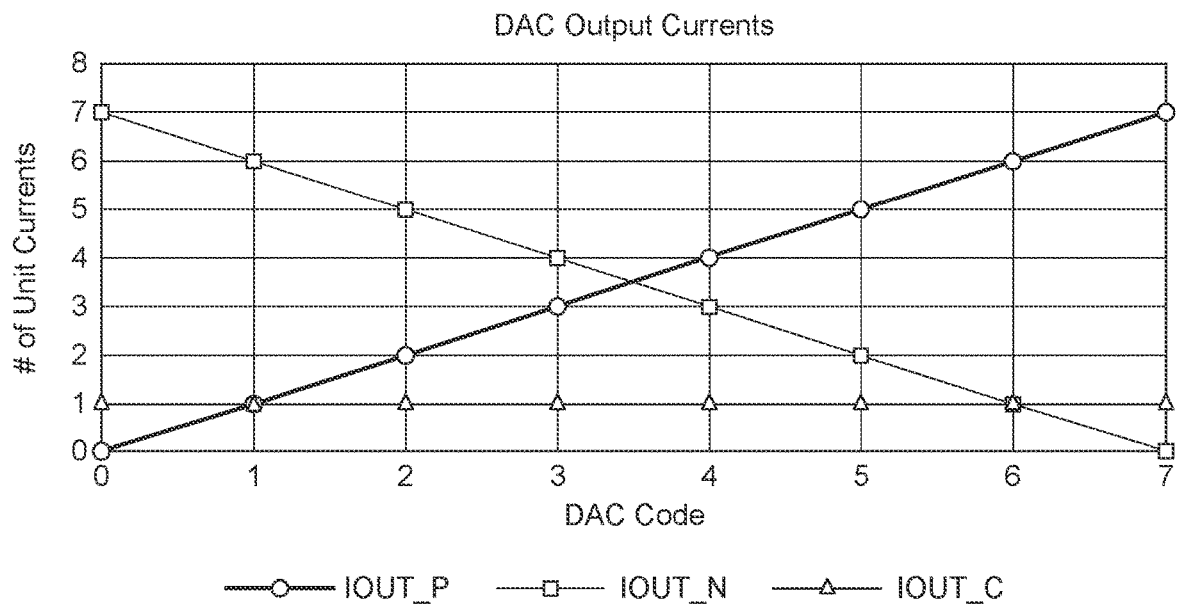
FIG. 3A is a graph showing a variation in the output currents according to the input DAC code according to one or more embodiments.

FIG. 3A is a graph showing a variation in the output currents according to the input DAC code. As noted above, the output current at the center output terminal IOUT_C remains constant, while the output currents at the positive and negative output terminals IOUT_P and IOUT_N are inversely related to each other based on the input DAC code. The amount of current received and output by the positive output terminal IOUT_P, excluding any leakage currents from connected PN junctions, matches the decimal value of the input DAC code.

Figure 3B:
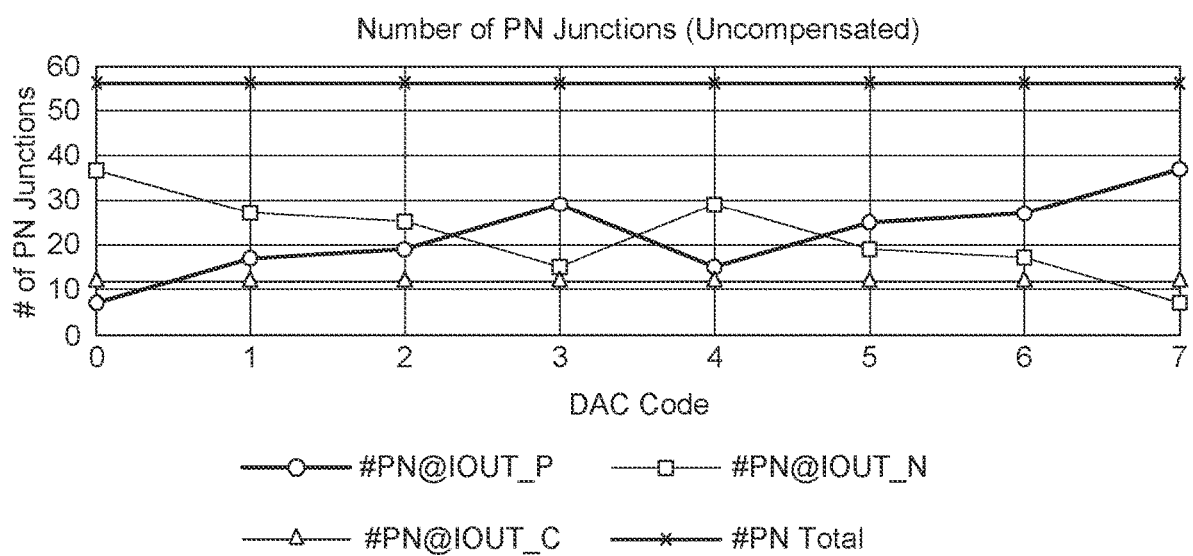
FIG. 3B is a graph showing a variation in a number of PN junctions connected to each output terminal based on the input DAC code according to one or more embodiments.

FIG. 3B is a graph showing a variation in a number of PN junctions connected to each output terminal IOUT_P, IOUT_C, and IOUT_N based on the input DAC code when the number of PN junctions connected to the positive and negative output terminals IOUT_P and IOUT_N is not compensated by the compensation circuit 600. This graph demonstrates the different in leakage currents received by the positive and negative output terminals IOUT_P and IOUT_N and how the difference changes depending on the input DAC code. As will be explained in greater detail below, the compensation circuit 600 is configured to equalize the number of PN junctions connected to each positive and negative output terminal IOUT_P and IOUT_N, thereby equalizing the amount of leakage current that is received by those output terminals. The number of PN junctions connected to the center output terminal IOUT_C does not need to be compensated since the number of PN junctions connected thereto remains the same regardless of the input DAC code.

FIG. 3C shows a table that summarizes the output currents at each output terminal originating from the current source stage 100 and a number of PN junctions connected to each output terminal based on the input DAC code made up of bits D2, D1, and D0 that represent a decimal value (e.g., a value ranging from 0-7).

A number of "uncompensated" PN junctions refers to those PN junctions that are connected from only the analog switch matrix (e.g., stages 200, 300, and 400), whereas a number of "compensated" PN junctions refers to those PN junctions that are connected from the analog switch matrix (e.g., stages 200, 300, and 400) plus those connected from the leakage compensation circuit 600.

While the total number of uncompensated PN junctions (#PN total) remains constant at 56, the number of uncompensated PN junctions connected to the positive and negative output terminals varies between 7 and 37 based on the input DAC code. The center output IOUT_C, which may be used to connect a dividing (sub) DAC is constantly connected to 12 PN junctions.

It can be observed that the number of PN junctions connected to the positive output terminal IOUT_P that varies based on the N-bit digital code and the number of PN junctions connected to the negative output terminal IOUT_N that varies based on N-bit digital code are inversely proportional to each other.

It can be found that, more general, the number of PN junctions switched by a DAC control bit (i.e., D2, D1, or D0) from the positive to the negative terminal is represented by the following equation:

$$\#PN = f(N,M) = ((N-M) \cdot 4 - 2) \cdot 2^M \quad (1),$$

where N is the binary bus width of the DAC (i.e., the number of total bits) and M is bit a position number, ranging from zero to N−1, of a particular bit of the input code. M=0 for the LSB (D0), M=N−1 for the MSB (D2 for a 3-bit DAC), and M=1 for control bit D1 (for a 3-bit DAC).

The number of fixed PN junctions #PN_fix on the positive and negative output is:

$$\#PN\_fix = f(N) = 2^N - 1 \quad (2).$$

The number of PN junctions #PN_center on the center output is:

$$\#PN\_center = f(N) = N \cdot 4 \quad (3).$$

The equations are valid for DACs with any bus width.

In a 3-bit DAC, the MSB (D2) switches over 8 PN junctions from the positive to the negative output terminal, bit 1 (D1) switches over 12 PN junctions from the positive to the negative output terminal, and the LSB (D0) switches over 10 PN junctions from the positive to the negative output terminal. This means that D2 is responsible for switching 8 PN junctions in the analog switch matrix from being connected to either the positive output terminal IOUT_P or to the negative output terminal IOUT_N depending on whether its bit value is 1 or 0, respectively. Likewise, D1 is responsible for switching 12 PN junctions in the analog switch matrix from being connected to either the positive output terminal IOUT_P or to the negative output terminal IOUT_N depending on whether its bit value is 1 or 0, respectively, and D0 is responsible for switching 10 PN junctions in the analog switch matrix from being connected to either the positive output terminal IOUT_P or to the negative output terminal IOUT_N depending on whether its bit value is 1 or 0, respectively.

Taking the example of the three bit DAC, when the MSB (D2) of the input DAC code changes from 0 to 1, the current on the positive output terminal IOUT_P increases by 4 unit currents (i.e., 4I) provided by the current source stage 100, while the current on the negative output terminal decreases by 4 unit currents. In other words, 4 unit currents are redirected from IOUT_N to IOUT_P by the analog switch matrix, and more specifically by the first stage 200 comprising switches 201-216. However, on top of this, the leakage current of 8 additional PN junctions is added to the current at the positive output terminal IOUT_P, while the same leakage current is deducted from the negative output terminal IOUT_N.

Accordingly, leakage current is to be compensated by the leakage compensation circuit 600 by ensuring that the same number of PN junctions are connected to positive and negative output terminals IOUT_P and IOUT_N regardless of the input DAC code. The leakage compensation circuit 600 provides additional PN junctions that can be switchably connected to the positive and negative output terminals IOUT_P and IOUT_N to equalize the total number of PN junctions connected to each of those output terminals. This means that as then number of PN junctions from the analog switch matrix (e.g., stages 200, 300, and 400) changes as the input DAC code changes, the leakage compensation circuit 600 compensates for the change by adding additional PN junctions to one of the output terminals while subtracting additional PN junctions from the output terminal. The total number of PN junctions connected to each of the positive and negative output terminals IOUT_P and IOUT_N due to the compensation remains constant and equal regardless of the input DAC code.

The table shown in FIG. 3C shows that the total number (#PN total) of PN junctions after compensation is increased from 56 to 92, meaning that the leakage compensation circuit 600 provides an additional 36 PN junctions to the system via an additional 18 transistors. The number of PN junctions connected to the positive and negative output terminals IOUT_P and IOUT_N after compensation is held constant at 40 PN junctions regardless of the input DAC code. Thus, as the decimal value increases, the number of uncompensated PN junctions (i.e., those from the analog switch matrix) connected to the IOUT_P increases, and the number of additional PN junctions provided by the leakage compensation circuit 600 is subtracted from being connected to IOUT_P and added as being connected to IOUT_N to maintain the same number of total compensated PN junctions connected to both IOUT_P and IOUT_N. The compensation operates in reverse as the decimal value decrease. Thus, the compensation is dynamic as the decimal value changes.

Figure 3D:
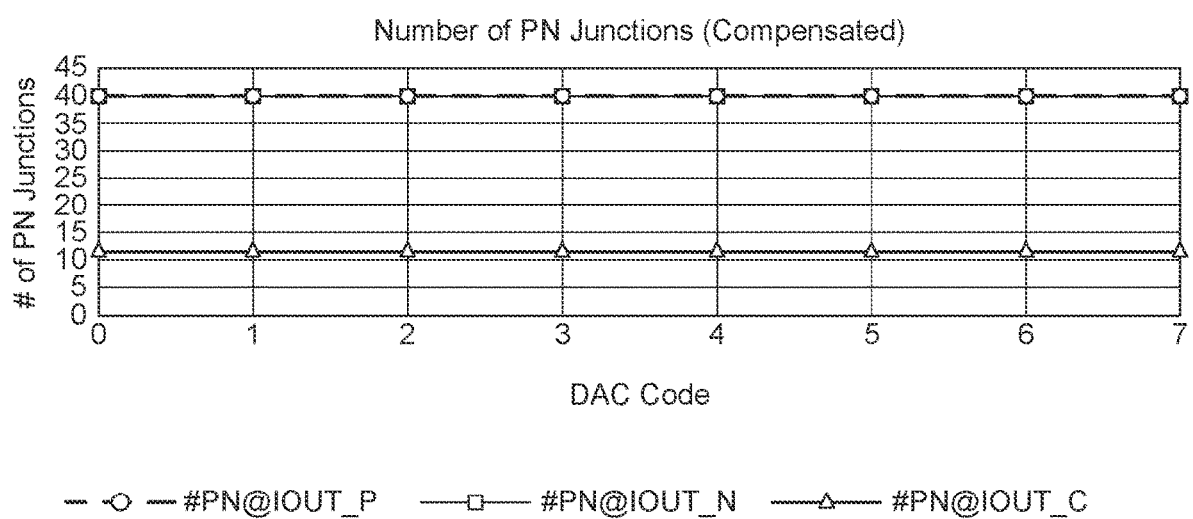
FIG. 3D is a graph showing a number of PN junctions connected to each output terminal for different input DAC codes after compensation by the leakage compensation circuit according to one or more embodiments.

FIG. 3D is a graph showing a number of PN junctions connected to each output terminal IOUT_P, IOUT_C, and IOUT_N for different input DAC codes after compensation by the leakage compensation circuit 600. The number of total compensated PN junctions connected to both IOUT_P and IOUT_N is held constant at 40 PN junctions each, while the number of total PN junctions connected to IOUT_C is held constant at 12 PN junctions.

It should be kept in mind that the leakage will only cancel out perfectly in simulation where no mismatch of leakage is modelled. On silicon, the compensation effect is limited. But a reduced implementation, using only the most significant bits of a DAC, is already an improvement at low area and complexity.

Turning back to FIG. 1, a leakage compensation circuit 600 is connected to the positive and negative output terminals IOUT_P and IOUT_N. The leakage compensation circuit 600 is configured to ensure that the positive and negative output terminals IOUT_P and IOUT_N are connected to the same number PN junctions, taking into account the number of PN junctions from the analog switch matrix the positive and negative output terminals are connected to.

For example, for an input code of 000, IOUT_P is connected to 7 PN junctions from the analog switch matrix and IOUT_N is connected to 37 PN junctions from the analog switch matrix. To balance the number of total PN junctions connected to each of the positive and negative output terminal, the leakage compensation circuit 600 provides additional PN junctions to which the positive and negative output terminals are connected so that the number of total (compensated) PN junctions connected to IOUT_P is equal to the number of total (compensated PN junctions connected to IOUT_N.

More specifically, the analog switch matrix introduces an imbalance in leakage current that flows to terminals IOUT_P and IOUT_N. To balance the amount of leakage current that flows out of terminals IOUT_P and IOUT_N, the leakage compensation circuit 600 provides additional leakage currents to terminals IOUT_P and IOUT_N based on the input code to compensate for the imbalance of leakage currents provided by the analog switch matrix. The result of providing additional leakage currents to terminals IOUT_P and IOUT_N based on the input code is an equal amount of leakage current flowing out of both terminals IOUT_P and IOUT_N, with some of the leakage current originating from the analog switch matrix and some of the leakage current (i.e., compensated leakage current) originating from the leakage compensation circuit 600.

The leakage compensation circuit 600 includes a group of compensation transistors for each bit of the input code, including group 601 corresponding to bit D2, group 602 corresponding to bit D1, and group 603 corresponding to bit D0. The transistors of these groups have their gates connected to ground GND, meaning they are always turned off. Nevertheless, the PN junctions of these transistors contribute to leakage current and these PN junctions are switchably connected to either output terminal IOUT_P or output terminal IOUT_N based on the bit that controls that on/off state of compensation transistors 605-610.

The transistors of groups 200, 300, 400, and 600 have the same dimensions to enable proper leakage compensation. Or, in more detail, the size of transistors Q1 to Q9 will mainly be determined by requirements on matching (which determines the integral non-linearity (INL) performance of the DAC) and noise. Most likely, they will be much larger than the technology limits. The transistors of groups 200, 300, and 400, which act as switches, might be much smaller than transistors Q1-Q9. They should be sized to have low enough on state resistance and negligible off state leakage. The compensation works best when the transistors of group 600 have the same dimension as the transistors of groups 200, 300, and 400.

Figure 4A:
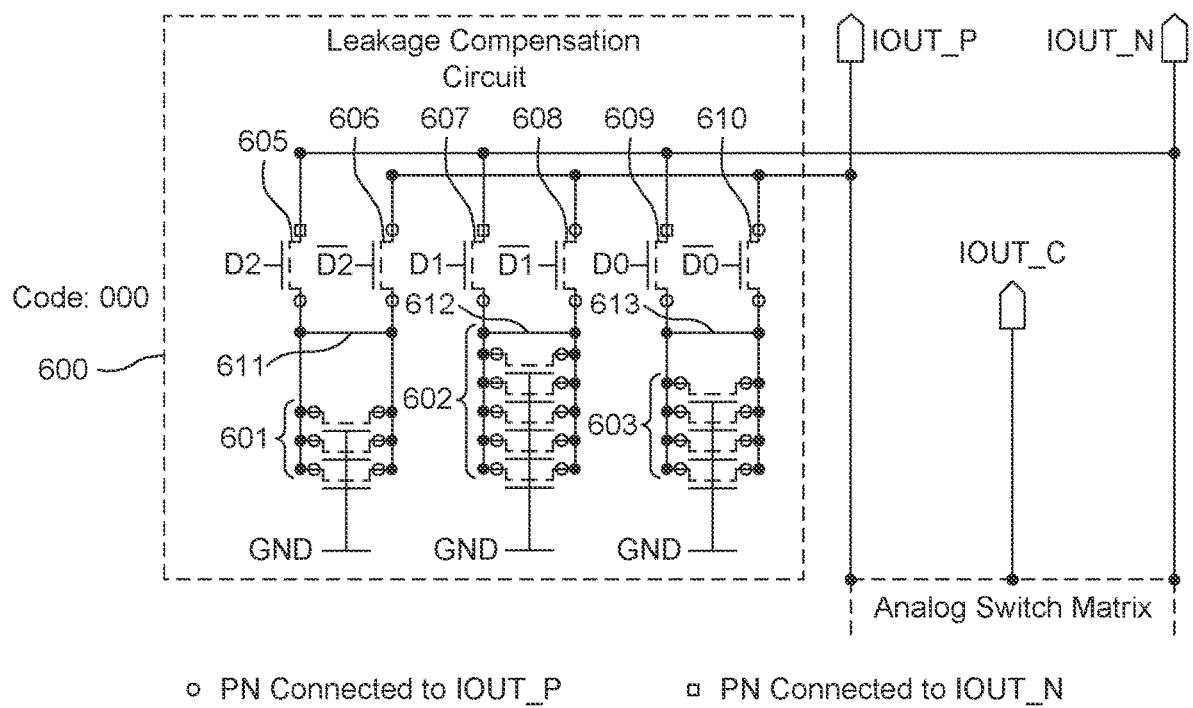
FIGS. 4A and 4B are schematic diagrams of the leakage compensation circuit provided with two different input codes 000 and 111, respectively, according to one or more embodiments.
Figure 4B:
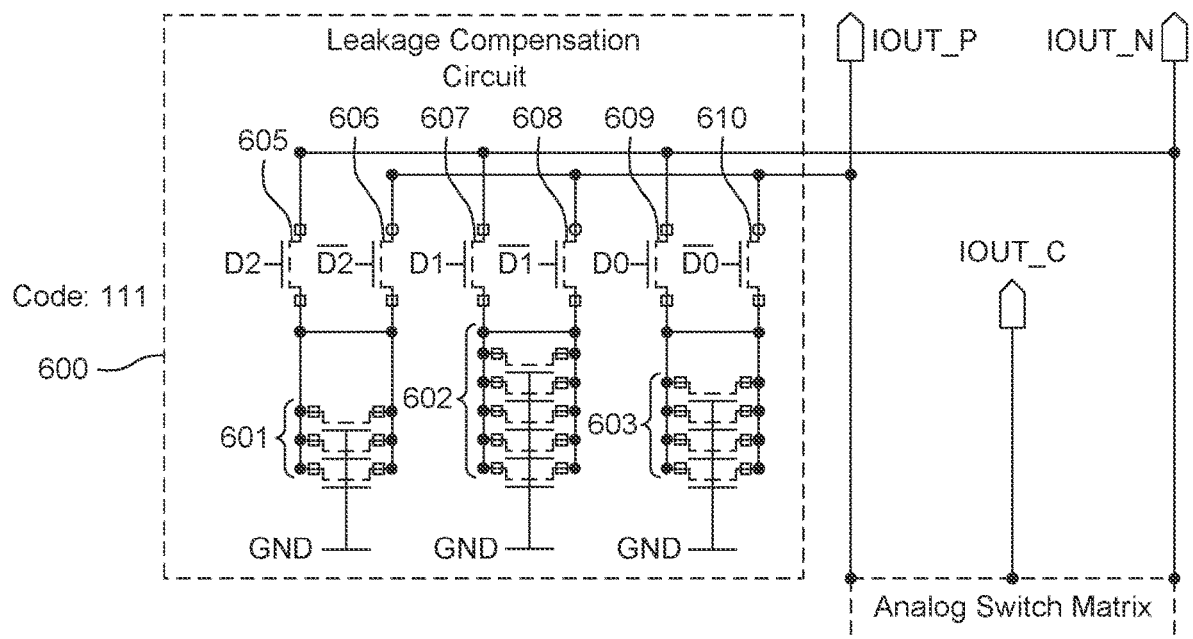

FIGS. 4A and 4B are schematic diagrams of the leakage compensation circuit 600 provided with two different input codes 000 and 111, respectively. FIGS. 4A and 4B show how the PN junctions of the leakage compensation circuit 600 are connected when these two codes are provided to the DAC.

Compensation transistors 605-610 are arranged in complementary pairs that are assigned to each bit of the input code and control how a corresponding group of compensation transistors is connected to the output terminals IOUT_P and IOUT_N. The switches of a pair are complementary to each other, meaning when one switch of the pair is on and the other switch of the pair is off. For example, one switch may receive an inverted bit value at its gate to place the switch's on/off state in the opposite state of its paired counterpart.

Transistors 605 and 606 form a first complementary pair that switchably connect the PN junctions of group 601 to either the output terminal IOUT_P or output terminal IOUT_N based on bit D2.

As can be seen in FIG. 4A, when bit D2 is zero, transistor 605 is off and transistor 606 is on. Accordingly, transistor 606 contributes 2 PN junctions to the positive terminal, transistor 605 contributes 1 PN junction to the negative terminal due to its direct connection to that terminal, and transistor 605 contributes 1 PN junction to the positive terminal through its indirect connection via turned-on transistor 606. In addition, the six PN junctions included in transistor group 601 are all connected to the positive terminal via turned-on transistor 606 and shorted connection 611.

In contrast, from FIG. 4B, when bit D2 is 1, transistor 606 is off and transistor 605 is on. Accordingly, transistor 605 contributes 2 PN junctions to the negative terminal, transistor 606 contributes 1 PN junction to the positive terminal due to its direct connection to that terminal, and transistor 606 contributes 1 PN junction to the negative terminal through its indirect connection via turned-on transistor 605. In addition, the six PN junctions included in transistor group 601 are all connected to the negative terminal via turned-on transistor 605 and shorted connection 611.

Accordingly, this compensation branch switchably connects a net of 8 PN junctions to either the positive or negative terminal based on the bit value of D2. As noted above, according to Equation 1, D2 is responsible for switching 8 PN junctions in the analog switch matrix from being connected to either the positive output terminal IOUT_P or to the negative output terminal IOUT_N depending on whether its bit value is 1 or 0, respectively. Thus, as the 8 PN junctions within the analog switch matrix are added to IOUT_P (D2=1), the leakage compensation circuit 600 adds a net of 8 PN junctions to IOUT_N to keep the total number of PN junctions connected to each of the positive and negative output terminal equal. Similarly, as the 8 PN junctions within the analog switch matrix are added to IOUT_N (D2=0), the leakage compensation circuit 600 adds a net of 8 PN junctions to IOUT_P to keep the total number of PN junctions connected to each of the positive and negative output terminal equal.

The number of additional PN junction currents connected to IOUT_P and IOUT_N by the leakage compensation circuit 600 can be summarized as follows:

D2=0: IOUTP: +9 PN junction leakage currents; IOUTN: +1 leakage junction current, D2=1: IOUTP: +1 PN junction leakage current; IOUTN: +9 PN junction leakage currents.

Transistors 607 and 608 form a second complementary pair that switchably connect the PN junctions of group 602 to either the output terminal IOUT_P or output terminal IOUT_N based on bit D1.

As can be seen in FIG. 4A, when bit D1 is zero, transistor 607 is off and transistor 608 is on. Accordingly, transistor 608 contributes 2 PN junctions to the positive terminal, transistor 607 contributes 1 PN junction to the negative terminal due to its direct connection to that terminal, and transistor 607 contributes 1 PN junction to the positive terminal through its indirect connection via turned-on transistor 608. In addition, the 10 PN junctions included in transistor group 602 are all connected to the positive terminal via turned-on transistor 608 and shorted connection 612.

In contrast, from FIG. 4B, when bit D1 is 1, transistor 608 is off and transistor 607 is on. Accordingly, transistor 607 contributes 2 PN junctions to the negative terminal, transistor 608 contributes 1 PN junction to the positive terminal due to its direct connection to that terminal, and transistor 608 contributes 1 PN junction to the negative terminal through its indirect connection via turned-on transistor 607. In addition, the 10 PN junctions included in transistor group 602 are all connected to the negative terminal via turned-on transistor 607 and shorted connection 612.

Accordingly, this compensation branch switchably connects a net of 10 PN junctions to either the positive or negative terminal based on the bit value of D1. As noted above, according to Equation 1, D1 is responsible for switching 12 PN junctions in the analog switch matrix from being connected to either the positive output terminal IOUT_P or to the negative output terminal IOUT_N depending on whether its bit value is 1 or 0, respectively. Thus, as the 10 PN junctions within the analog switch matrix are added to IOUT_P (D1=1), the leakage compensation circuit 600 adds a net of 12 PN junctions to IOUT_N to keep the total number of PN junctions connected to each of the positive and negative output terminal equal. Similarly, as the 12 PN junctions within the analog switch matrix are added to IOUT_N (D1=0), the leakage compensation circuit 600 adds a net of 12 PN junctions to IOUT_P to keep the total number of PN junctions connected to each of the positive and negative output terminal equal.

The number of additional PN junction currents connected to IOUT_P and IOUT_N by the leakage compensation circuit 600 can be summarized as follows:

D1=0: IOUTP: +13 PN junction leakage currents; IOUTN: +1 leakage junction current, D1=1: IOUTP: +1 PN junction leakage current; IOUTN: +13 PN junction leakage currents.

Transistors 609 and 610 form a third complementary pair that switchably connect the PN junctions of group 603 to either the output terminal IOUT_P or output terminal IOUT_N based on bit D0.

As can be seen in FIG. 4A, when bit D0 is zero, transistor 609 is off and transistor 610 is on. Accordingly, transistor 610 contributes 2 PN junctions to the positive terminal, transistor 609 contributes 1 PN junction to the negative terminal due to its direct connection to that terminal, and transistor 609 contributes 1 PN junction to the positive terminal through its indirect connection via turned-on transistor 610. In addition, the 8 PN junctions included in transistor group 603 are all connected to the positive terminal via turned-on transistor 610 and shorted connection 613.

In contrast, from FIG. 4B, when bit D0 is 1, transistor 610 is off and transistor 609 is on. Accordingly, transistor 609 contributes 2 PN junctions to the negative terminal, transistor 610 contributes 1 PN junction to the positive terminal due to its direct connection to that terminal, and transistor 610 contributes 1 PN junction to the negative terminal through its indirect connection via turned-on transistor 609. In addition, the 8 PN junctions included in transistor group 603 are all connected to the negative terminal via turned-on transistor 609 and shorted connection 613.

Accordingly, this compensation branch switchably connects a net of 10 PN junctions to either the positive or negative terminal based on the bit value of D0. As noted above, according to Equation 1, D0 is responsible for switching 10 PN junctions in the analog switch matrix from being connected to either the positive output terminal IOUT_P or to the negative output terminal IOUT_N depending on whether its bit value is 1 or 0, respectively. Thus, as the 10 PN junctions within the analog switch matrix are added to IOUT_P (D0=1), the leakage compensation circuit 600 adds a net of 10 PN junctions to IOUT_N to keep the total number of PN junctions connected to each of the positive and negative output terminal equal. Similarly, as the 10 PN junctions within the analog switch matrix are added to IOUT_N (D0=0), the leakage compensation circuit 600 adds a net of 10 PN junctions to IOUT_P to keep the total number of PN junctions connected to each of the positive and negative output terminal equal.

The number of additional PN junction currents connected to IOUT_P and IOUT_N by the leakage compensation circuit 600 can be summarized as follows:

D0=0: IOUTP: +11 PN junction leakage currents; IOUTN: +1 leakage junction current, D0=1: IOUTP: +1 PN junction leakage current; IOUTN: +11 PN junction leakage currents.

Accordingly, each compensation branch of the leakage compensation circuit 600 connects exactly the opposite of number leakage currents into the positive or negative output terminal that is caused by the analog switch matrix (e.g., stages 200, 300, and 400) for a corresponding bit to balance the amount of total leakage current received by the positive and negative output terminals IOUT_P and IOUT_N. Said differently, the leakage compensation circuit 600 ensures that there is an equal or symmetrical distribution of leakage currents flowing to the positive output terminal IOUT_P and the negative output terminal IOUT_N.

The leakage compensation circuit 600 can be extended to a DAC with more than three bits by adding additional compensation branches for each bit. The number of net PN junctions to be added by a compensation branch can be determined by Equation 1. For example, FIG. 5 shows a table that summarizes the output currents at each output terminal originating from a current source stage of a 4-bit DAC and a number of PN junctions connected to each output terminal based on the input DAC code made up of bits D3, D2, D1, and D0 that represent a decimal value (e.g., a value ranging from 0-15). The table also shows the compensated number of PN junctions/leakage currents connected to the positive and negative output terminals IOUT_P and IOUT_N, which include those from the analog switch matrix and those added by the leakage compensation circuit.

By adding a leakage compensation circuit to the DAC architecture, a DAC can be built to be more robust and less error prone against leakage currents.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A thermometric digital-to-analog converter (DAC) configured to convert an N-bit digital code into analog output currents, wherein N is an integer greater than one, the thermometric DAC comprising:

$2^N$ current sources configured to generate $2^N$ currents;

a positive output terminal configured to receive a first portion of the $2^N$ currents as a first output current based on the N-bit digital code;

a negative output terminal configured to receive a second portion of the $2^N$ currents as a second output current based on the N-bit digital code, wherein the second portion is inversely proportional to the first portion;

an analog transistor matrix coupled between the $2^N$ current sources and the positive and negative output terminals, wherein the analog transistor matrix comprises a plurality of PN junctions that are switchably connected to the positive output terminal and the negative output terminal based on the N-bit digital code, including a first number of PN junctions connected to the positive output terminal that varies based on the N-bit digital code and a second number of PN junctions connected to the negative output terminal that varies based on N-bit digital code; and a compensation circuit comprising a plurality of additional PN junctions that are switchably connected to the positive output terminal and the negative output terminal based on the N-bit digital code, wherein the compensation circuit is configured to connect a first number of additional PN junctions to the positive output terminal based on the N-bit digital code and connect a second number of additional PN junctions to the negative output terminal based on the N-bit digital code such that a first sum of the first number of PN junctions and the first number of additional PN junctions is equal to a second sum of the second number of PN junctions and the second number of additional PN junctions.

2. The thermometric DAC of claim 1, wherein the analog transistor matrix is configured to receive the $2^N$ currents, steer the first portion of the $2^N$ currents to the positive output terminal based on the N-bit digital code, and steer the second portion of the $2^N$ currents to the negative output terminal based on the N-bit digital code.

3. The thermometric DAC of claim 1, wherein:
the first number of PN junctions is different from the second number of PN junctions, and
the first number of additional PN junctions is different from the second number of additional PN junctions.

4. The thermometric DAC of claim 3, wherein the first number of PN junctions is inversely proportional to the second number of PN junctions.

5. The thermometric DAC of claim 1, further comprising:
a center output terminal configured to receive a third portion of the $2^N$ currents as a third output current,
wherein, for each decimal value of the N-bit code, a quantity of the third portion is equal to a quantity of one of the $2^N$ currents.

6. The thermometric DAC of claim 5, wherein the analog transistor matrix is configured to switchably connect the plurality of PN junctions to the positive output terminal, the negative output terminal, and the center output terminal based on the N-bit digital code, including the first number of PN junctions connected to the positive output terminal that varies based on the N-bit digital code, the second number of PN junctions connected to the negative output terminal that varies based on N-bit digital code, and a third number of PN junctions connected to the center output terminal, wherein the third number of PN junctions is fixed independent of the N-bit digital code.

7. The thermometric DAC of claim 6, wherein the analog transistor matrix is configured to receive the $2^N$ currents, steer the first portion of the $2^N$ currents to the positive output terminal based on the N-bit digital code, steer the second portion of the $2^N$ currents to the negative output terminal based on the N-bit digital code, and steer the third portion of the $2^N$ currents to the center output terminal, the third portion having a fixed quantity independent of the decimal value of the N-bit digital code.

8. The thermometric DAC of claim 1, wherein the compensation circuit comprises:
a first compensation branch comprising a first plurality of transistors comprising a first portion of the plurality of additional PN junctions, wherein the compensation circuit is configured to switchably connect the first portion of the plurality of additional PN junctions to either the positive output terminal or the negative output terminal based on a value of a first bit of the N-bit digital code in order to ensure the first sum is equal to the second sum.

9. The thermometric DAC of claim 8, wherein the first plurality of transistors include:
a first complementary pair of transistors controlled by the first bit of the N-bit digital code; and
a first group of transistors that are switchably connected to either the positive output terminal or the negative output terminal by the first complementary pair of transistors based on the value of the first bit of the N-bit digital code.

10. The thermometric DAC of claim 9, wherein a first transistor of the first complementary pair of transistors is connected between the positive output terminal and the first group of transistors and a second transistor of the first complementary pair of transistors is connected between the negative output terminal and the first group of transistors.

11. The thermometric DAC of claim 10, wherein the first transistor of the first complementary pair of transistors is turned on by a first value of the first bit of the N-bit digital code and the second transistor of the first complementary pair of transistors is turned on by a second value of the first bit of the N-bit digital code.

12. The thermometric DAC of claim 8, wherein the compensation circuit comprises:
a second compensation branch comprising a second plurality of transistors comprising a second portion of the plurality of additional PN junctions, wherein the compensation circuit is configured to switchably connect the second portion of the plurality of additional PN junctions to either the positive output terminal or the negative output terminal based on a value of a second bit of the N-bit digital code in order to ensure the first sum is equal to the second sum.

13. The thermometric DAC of claim 12, wherein:
the first plurality of transistors include:
a first complementary pair of transistors controlled by the first bit of the N-bit digital code; and
a first group of transistors that are switchably connected to either the positive output terminal or the negative output terminal by the first complementary pair of transistors based on the value of the first bit of the N-bit digital code; and
the second plurality of transistors include:
a second complementary pair of transistors controlled by the second bit of the N-bit digital code; and
a second group of transistors that are switchably connected to either the positive output terminal or the negative output terminal by the second complementary pair of transistors based on the value of the second bit of the N-bit digital code.

14. The thermometric DAC of claim 12, wherein the compensation circuit comprises:
a third compensation branch comprising a third plurality of transistors comprising a third portion of the plurality of additional PN junctions, wherein the compensation circuit is configured to switchably connect the third portion of the plurality of additional PN junctions to either the positive output terminal or the negative output terminal based on a value of a third bit of the N-bit digital code in order to ensure the first sum is equal to the second sum.

15. The thermometric DAC of claim 12, wherein:
the first plurality of transistors include:
a first complementary pair of transistors controlled by the first bit of the N-bit digital code; and
a first group of transistors that are switchably connected to either the positive output terminal or the negative output terminal by the first complementary pair of transistors based on the value of the first bit of the N-bit digital code;
the second plurality of transistors include:
a second complementary pair of transistors controlled by the second bit of the N-bit digital code; and
a second group of transistors that are switchably connected to either the positive output terminal or the negative output terminal by the second complementary pair of transistors based on the value of the second bit of the N-bit digital code; and
the third plurality of transistors include:
a third complementary pair of transistors controlled by the third bit of the N-bit digital code; and
a third group of transistors that are switchably connected to either the positive output terminal or the negative output terminal by the third complementary pair of transistors based on the value of the third bit of the N-bit digital code.

16. A method of converting an N-bit digital code into analog output currents, wherein N is an integer greater than one, the method comprising:
generating $2^N$ currents;
receiving, by a positive output terminal, a first portion of the $2^N$ currents as a first output current based on the N-bit digital code;
receiving, by a negative output terminal, a second portion of the $2^N$ currents as a second output current based on the N-bit digital code, wherein the second portion is inversely proportional to the first portion;
switchably connecting a plurality of PN junctions to the positive output terminal and the negative output terminal based on the N-bit digital code, including a first number of PN junctions connected to the positive output terminal that varies based on the N-bit digital code and a second number of PN junctions connected to the negative output terminal that varies based on N-bit digital code; and
switchably connecting a plurality of additional PN junctions to the positive output terminal and the negative output terminal based on the N-bit digital code, including connecting a first number of additional PN junctions to the positive output terminal based on the N-bit digital code and connecting a second number of additional PN junctions to the negative output terminal based on the N-bit digital code such that a first sum of the first number of PN junctions and the first number of additional PN junctions is equal to a second sum of the second number of PN junctions and the second number of additional PN junctions.

17. The method of claim 16, wherein:
  the first number of PN junctions is different from the second number of PN junctions, and
  the first number of additional PN junctions is different from the second number of additional PN junctions.

18. The method of claim 17, wherein the first number of PN junctions is inversely proportional to the second number of PN junctions.

19. The method of claim 16, further comprising:
  receiving, by a center output terminal, a third portion of the $2^N$ currents as a third output current, wherein, for each decimal value of the N-bit code, a quantity of the third portion is equal to a quantity of one of the $2^N$ currents; and
  switchably connecting the plurality of PN junctions to the positive output terminal, the negative output terminal, and the center output terminal based on the N-bit digital code, including the first number of PN junctions connected to the positive output terminal that varies based on the N-bit digital code, the second number of PN junctions connected to the negative output terminal that varies based on N-bit digital code, and a third number of PN junctions connected to the center output terminal, wherein the third number of PN junctions is fixed regardless of the N-bit digital code.

20. The method of claim 16, further comprising:
  switchably connecting a first portion of the plurality of additional PN junctions to either the positive output terminal or the negative output terminal based on a value of a first bit of the N-bit digital code in order to ensure the first sum is equal to the second sum.

21. The method of claim 20, further comprising:
  switchably connecting a second portion of the plurality of additional PN junctions to either the positive output terminal or the negative output terminal based on a value of a second bit of the N-bit digital code in order to ensure the first sum is equal to the second sum.

22. The method of claim 21, further comprising:
  switchably connecting a third portion of the plurality of additional PN junctions to either the positive output terminal or the negative output terminal based on a value of a third bit of the N-bit digital code in order to ensure the first sum is equal to the second sum.

* * * * *